United States Patent [19]

Arthur et al.

[11] Patent Number: 4,902,985
[45] Date of Patent: Feb. 20, 1990

[54] MICROWAVE REFLECTIION AMPLIFIERS HAVING INCREASED BANDWIDTH

[75] Inventors: Thomas K. Arthur, Milford; Michael H. Cobb, Maynard; James W. McClymonds, Waltham, all of Mass.

[73] Assignee: Raytheon Company, Lexington, Mass.

[21] Appl. No.: 160,546

[22] Filed: Feb. 25, 1988

[51] Int. Cl.[4] ............................ H03F 3/10; H03F 3/60
[52] U.S. Cl. ...................................... 330/287; 230/177
[58] Field of Search .................. 330/47, 287, 306, 177

[56] References Cited

U.S. PATENT DOCUMENTS

| | | | |
|---|---|---|---|
| 4,005,372 | 1/1977 | Ho et al. | 330/287 |
| 4,121,174 | 10/1978 | Aston | 330/287 |
| 4,189,683 | 2/1980 | Fassett et al. | 330/287 |
| 4,514,699 | 4/1985 | Kariatsumari et al. | 330/286 |
| 4,517,527 | 5/1985 | Aihara et al. | 330/287 |
| 4,583,058 | 4/1986 | McClymonds | 331/96 |
| 4,643,992 | 1/1987 | Brown | 330/47 |

OTHER PUBLICATIONS

Ma et al., "V-Band High-Power Impatt Amplifier", Conf. Growth for the 80's, 1980, IEEE TTT-S Microwave Symp. D. C., pp. 73-74.
Alderstein et al., "Network Analysis . . . Magictic", Microw. S., vol. 31, #7, pp. 99-105, 7/88, Abst. only.
Ward et al., "A Stable Broadband IMPATT Amplifier", Int. Microw. Sysm. Dig., 6/84, S. F. Calif., pp. 486-488.

Primary Examiner—Nelson Moskowitz
Attorney, Agent, or Firm—Denis G. Maloney; Richard M. Sharkansky

[57] ABSTRACT

A four diode reflection amplifier having a relatively wide bandwidth of at least 5 percent over the frequency range of 43.5 to 45.5 GHz includes three magic Ts arranged to provide a 4-way passive power combiner. The 4-way passive power combiner symmetrically couples each of the four diode amplifiers to an input/output port of the reflection amplifier. To provide the improved bandwidth performance, a perturbation impedance in the form of a single shunt capacitance is inserted at the input/output port of the reflection amplifier to provide a selected perturbation in the load impedance and hence the reflection characteristic seen by the reflection amplifier over a selected band of operation of the amplifier.

12 Claims, 4 Drawing Sheets

MICROWAVE REFLECTIION AMPLIFIERS HAVING INCREASED BANDWIDTH

The Government has rights in this invention pursuant to Contract No. F30602-84-C-0197 awarded by the Department of the Air Force, RADC, Rome, N.Y.

BACKGROUND OF THE INVENTION

This invention relates generally to microwave devices and more particularly to microwave reflection amplifiers.

As is known in the art, a microwave reflection amplifier includes negative resistance devices such as IMPATT diodes, disposed in resonant circuits which are passively power combined to provide higher output power. The passive power combiner also matches the active device resonant circuit impedance to the impedance of an external load. The reflection amplifier has input waves and output waves sharing the same port (i.e. the I/O port) of the amplifier. An input wave fed to the I/O port is split by the passive power combiner and propagates towards each of the negative resistance devices, whereas the output waves which are amplified versions of the input waves propagate away from each of the negative resistance devices to the power combiner where they are combined to provide a high power output wave.

The bandwidth of a reflection amplifier is determined primarily by the frequency range over which the microwave resonant circuit can generate the proper load impedance for the active device. In general, reflection amplifiers will have the highest gain at a single frequency, and the gain will drop off or "roll off" sharply as frequency varies above or below this single frequency. For a narrow band application, this rolloff in frequency is small and acceptable. However, for higher bandwidths on the order of 5% or more, for example, this "roll off" is appreciable and undesireable. Therefore, for negative resistance devices, it is difficult to obtain a large bandwidth from such a microwave circuit. Accordingly, a technique is required to increase the bandwidth of narrow band devices such as IMPATT diodes when incorporated in reflection amplifiers.

SUMMARY OF THE INVENTION

In accordance with the present invention, a microwave reflection amplifier includes at least a pair of negative resistance devices such as a pair of IMPATT diodes which are combined by a passive power combiner. The output of the passive power combiner is provided with means for perturbing the loading impedance of the negative resistance amplifier modules in such a manner that the gain flatness of the assembly is increased over a selected bandwidth of operation. With this arrangement, the perturbation impedance will be referred back to the input of each amplifier module and by proper selection of the perturbation impedance the gain at the center of the operating band of the amplifier will decrease and the gain at the edges of the band of the amplifier will increase. In this manner, the gain flatness of the assembly is substantially increased over a selected bandwidth, providing a broadband reflection amplifier.

In a preferred embodiment, the perturbation impedance means include a small, dielectric member which is disposed in a selected aperture in the input/output port of the reflection amplifier. With this arrangement, a simple, mechanically expedient, impedance perturbation is provided.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
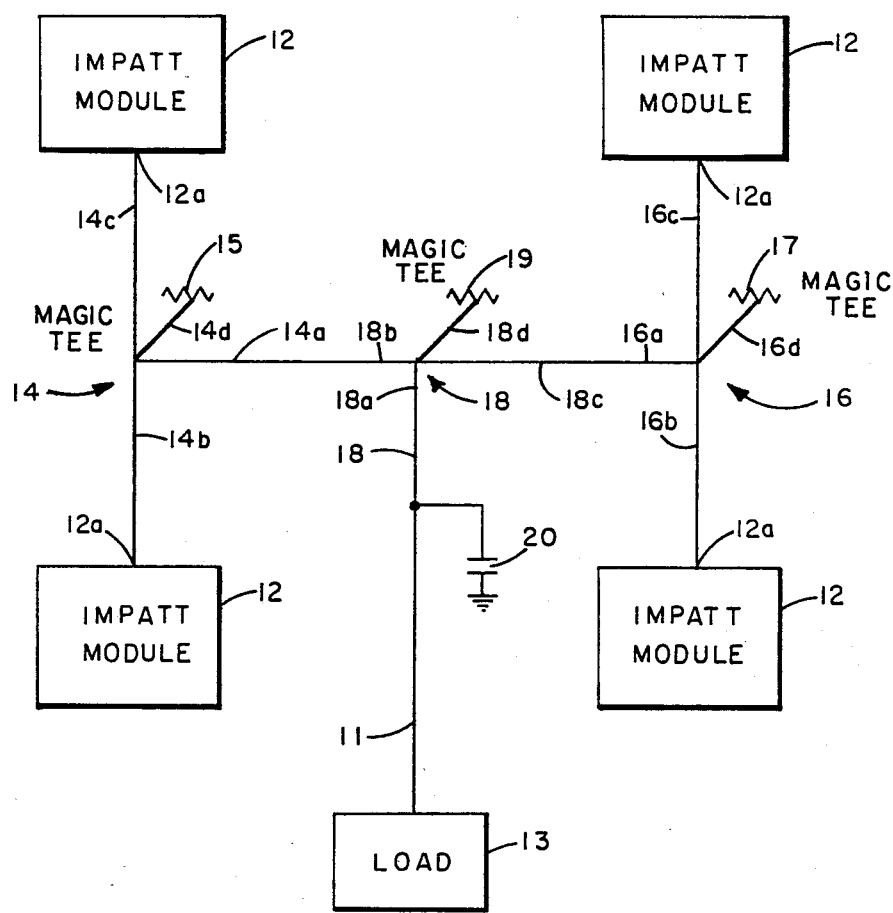
FIG. 1 is a schematic representation of a broadband reflection amplifier having four IMPATT diode amplifiers passively power combined in accordance with the present invention.

Referring now to FIG. 1, a schematic representation of a four diode reflection amplifier 10 having a capacitive perturbation 20 disposed at the input/output port 11 of the amplifier 10 is shown to include here four IMPATT diode high power modules 12 which are passively power combined here, via magic Ts 14, 16, and 18. A magic T is a 4-port symmetrical, matched waveguide circuit belonging in the generic class of hybrid Ts. In a magic T also referred to as a "matched hybrid T" two ports of the device are generally referred to as the E-plane arm and the H-plane arm, with the other two ports each referred to as the colinear arms. The magic T has the property that a wave entering the E-plane arm will excite waves of equal magnitude and opposite phase in the pair of colinear arms, whereas a wave entering the H-plane will excite waves of equal magnitude and equal phase in the pair of colinear arms. Due to the symmetry of the device, a wave in the E-plane arm will not excite a dominant mode wave in the H-plane arm and visa versa.

In particular, input/output ports 12a of a first pair of IMPATT diode modules 12 are coupled to the colinear arms 14b and 14c of magic T 14, the E-plane arm is used as an input/output port of the magic T 14, and the H-plane arm is terminated in a suitable characteristic impedance 15. Similarly, a second pair of IMPATT diode modules 12 are coupled via a second magic T 16. The input/output port 12a of the diode modules are coupled to the pair of colinear arms 16b and 16c, with the E-plane arm 16a of the magic T 16 being provided as input/output port of the magic T, and the H-plane arm 16d being terminated in a suitable characteristic impedance 17. The E-plane arms 14a and 16a of magic T's 14 and 16, respectively, are coupled to corresponding colinear-arms 18b and 18c of magic T 18, with the E-plane arm 18a of magic T 18 being provided as the input/output port 11 of the reflection amplifier 10 and the H-plane arm 18d of magic T 18 being terminated in a suitable characteristic impedance 19. Alternatively, the E-plane arms could have been terminated and the H-plane arms could have been used as ports. The round trip nature of waves in a reflection amplifier will cancel the 180° phase shifts resulting from use of E or H-plane arms.

Here, a small, capacitive perturbation impedance 20 is disposed in the input/output port 11 of the reflection amplifier 10 and provides a small perturbation in the impedance characteristics "seen by" each one of the IMPATT diode modules 12. Since the magic T's 14, 16, and 18 have the property that all of the ports of the magic T are matched, by placing a small impedance perturbation at the output port 11 that impedance perturbation is referred back with equal perturbation magnitude and phase at each one of modules 12, and thus the impedance seen by each diode module 12 will be perturbated by the same amount. Accordingly, by appropiate selection of the impedance 20, a requisite amount of perturbation in load impedance is "seen by" each one of the input diode modules.

Figure 2:
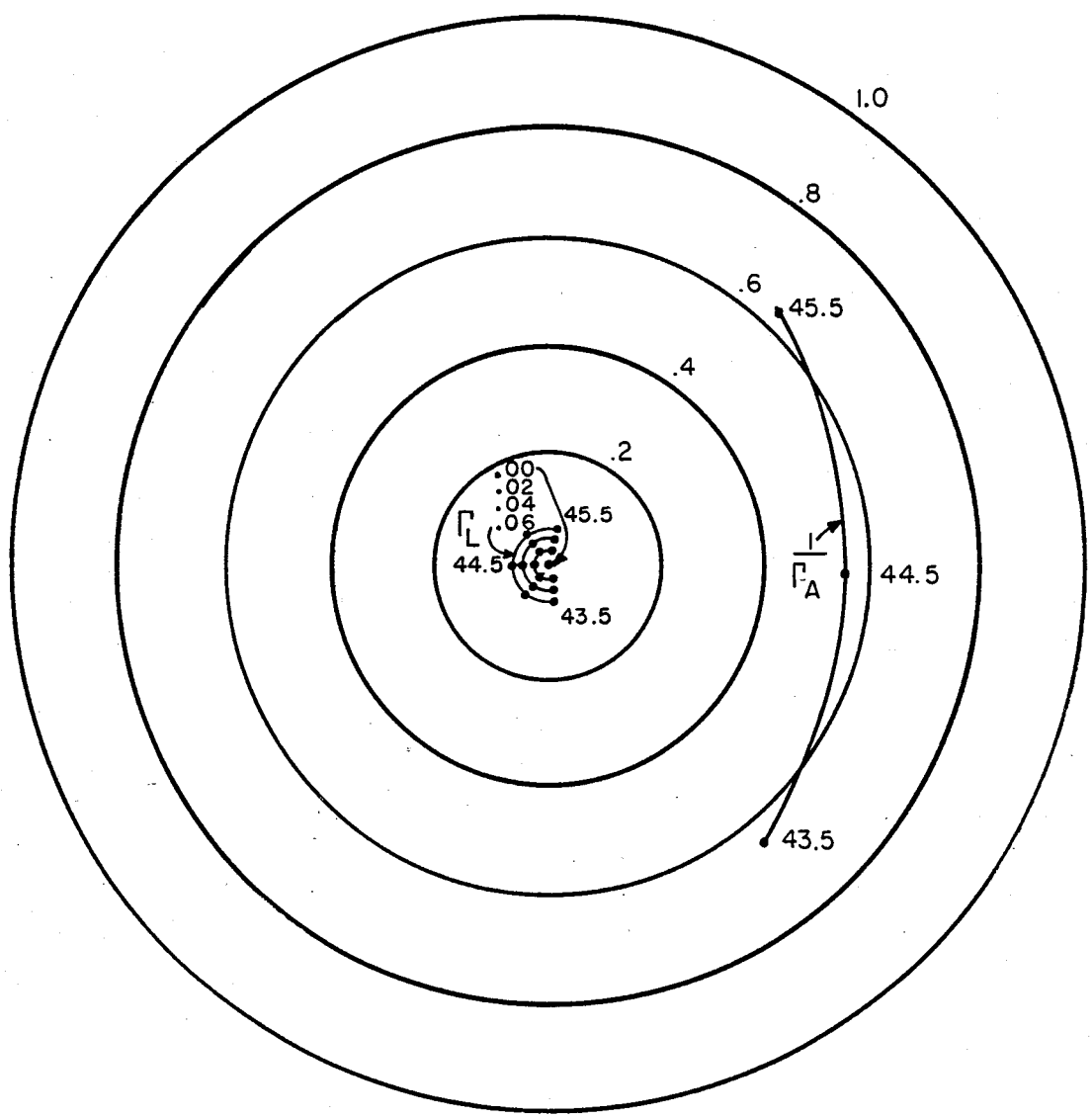
FIG. 2 is a polar plot of the load presented to each of the individual amplifier modules of the reflection amplifier of FIG. 1 for different values of perturbation impedance magnitude.

Referring now to FIG. 2, a plot of the reciprocal of reflection coefficient ($1\Gamma_A$) for each one of the diode modules over the frequency range of 43.5 to 45.5 GHz is shown, as is, the reflection coefficient "seen by" each module 12 for perturbation magnitudes of 0.00, 0.02, 0.04, and 0.06. A reflection coefficient $\Gamma$ is defined as the ratio of amplitude and phase of an output wave to the amplitude and phase of an input wave. The arc length of the reflection coefficient of the perturbation is chosen to be related to 360° minus the arc length of the reciprocal of the reflection coefficient of the amplifier modules ($1\Gamma_A$). Here for the reflection amplifier, shown in FIG. 1, the distance from any IMPATT diode module to the shunt capacitance is equal to about 4 guide wavelengths. Accordingly, the phase angle of the mismatch (i.e. the orientation and length of the arc of $\Gamma_L$ with respect to ($1\Gamma_A$)) at the module ports is provided by rotating the phase of the input mismatch through the electrical pathlength separating it from the module ports. This pathlength is chosen so that the reflection coefficient of the perturbation at the module ports sweeps out a predetermined arc on the polar chart plot, as shown in FIG. 2, over the operating band. The exact orientation of the arc may be adjusted by placing the perturbation impedance either closer to or further from the reflection amplifier with respect to the point's nonimal 4-guide wavelength distance. The magnitude of the perturbation is controlled by the magnitude of the discontinuity.

Figure 3:
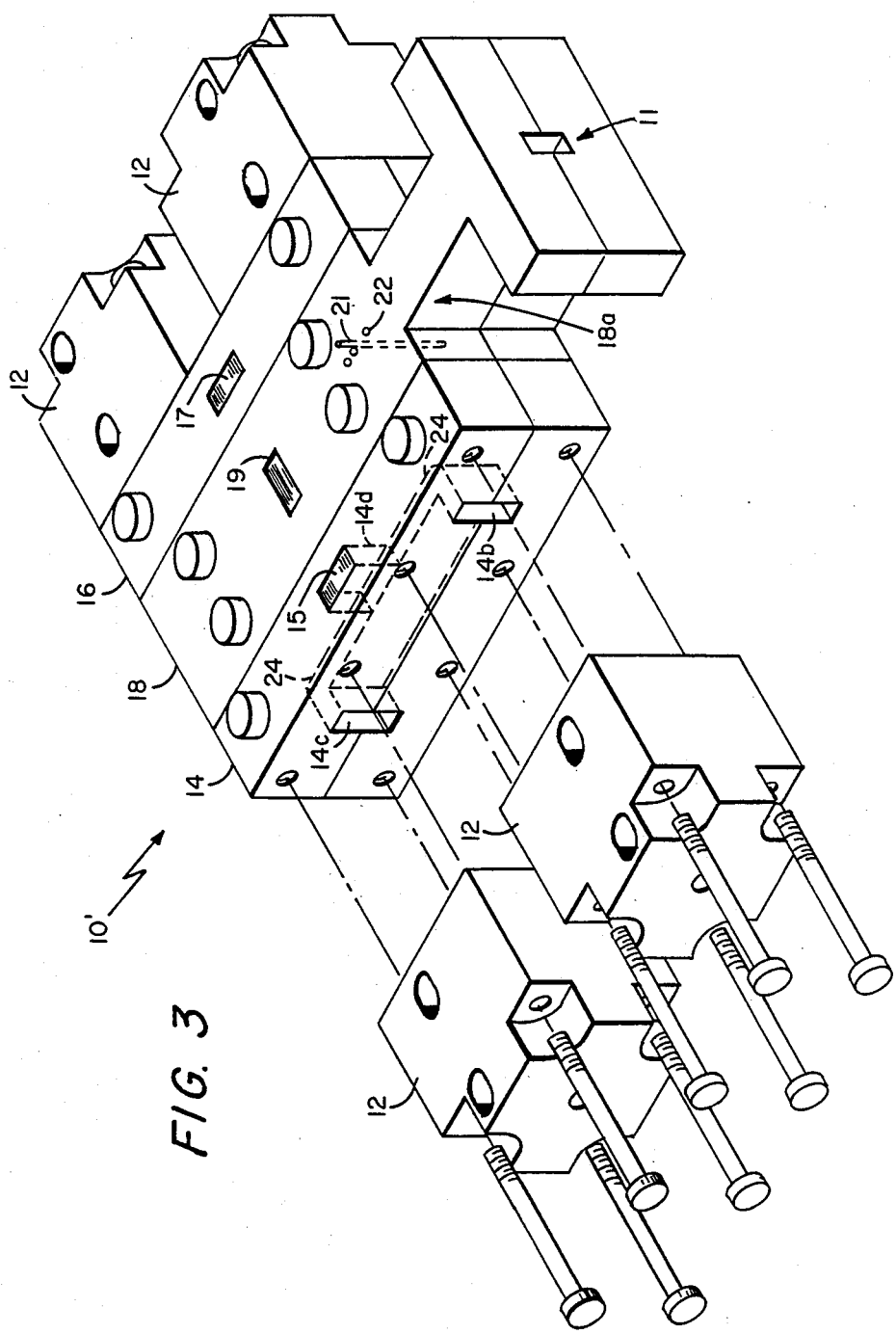
FIG. 3 is a composite isometric view of an embodiment of a four diode reflection amplifier in accordance with the present invention.

Referring now to FIG. 3, an embodiment 10' of a reflection amplifier is shown. Here the perturbation is provided by a ceramic rod 21 that is inserted into one of a series of small holes 22 disposed through the narrow wall of a waveguide portion (not depicted) of magic Tee E-plane arm 18a which is the input/output port 11. The depth of penetration of the ceramic rod 21 controls the magnitude of the mismatch, and the orientation of the arc is adjusted in discrete steps by inserting the rod in different, closely spaced holes 22 which are disposed along the the propagation path. The chosen arc length of $\Gamma_L$ is approximately 360° minus the arc length of $1\Gamma_A$. This arc length causes the gain at the band edges to be increased by an amount that is very close to the decrease in gain at the center of the band. Other arc lengths and orientations of $\Gamma_L$ may be used if the unperturbed gain curve is not symmetrical. The magic T's shown schematically as 14 and 16 (FIG. 1) are here provided having curved paths 24 (FIG. 3) for the colinear arms of the respective Ts to interconnect to the IMPATT diode modules 12. The size of the hole 22 is chosen so that the cut off frequency of the hole with the dielectric member 21 inerted into the hole 22 is greater than the operating frequency of the reflection amplifier 10. For the embodiment shown, the hole has a diameter of 1/32 inch.

In a preferred embodiment of the invention, a broadband reflection amplifier is provided by using a dielectric here ceramic ($Al_2O_3$) rod 21 which at the frequency of operation acts as a shunt capacitive perturbation. The rod is inserted into the waveguide at the I/O port 11 through one of a series of small apertures 22 disposed in the narrow wall of the waveguide. The magnitude of the perturbation is controlled by varying the depth of pentration of the ceramic rod in the waveguide, and the phase orientation of the arc characteristic of $\Gamma_L$ is controlled by moving the perturbation along the transmission path a small predetermined distance by placing the rod in one of a series of small holes which are spaced along the waveguide in discrete increments. The arc is selected as stated previously by selecting the electrical pathlength between the electrical perturbation and the IMPATT diode amplifier modules 12.

The diameter of the rod and dielectric constant will each affect the magnitude of the perturbation. Increasing each will increase the perturbation.

As an alternate embodiment, an inductive perturbation may be similarly provided by inserting a conductive member in said holes.

Figure 4:
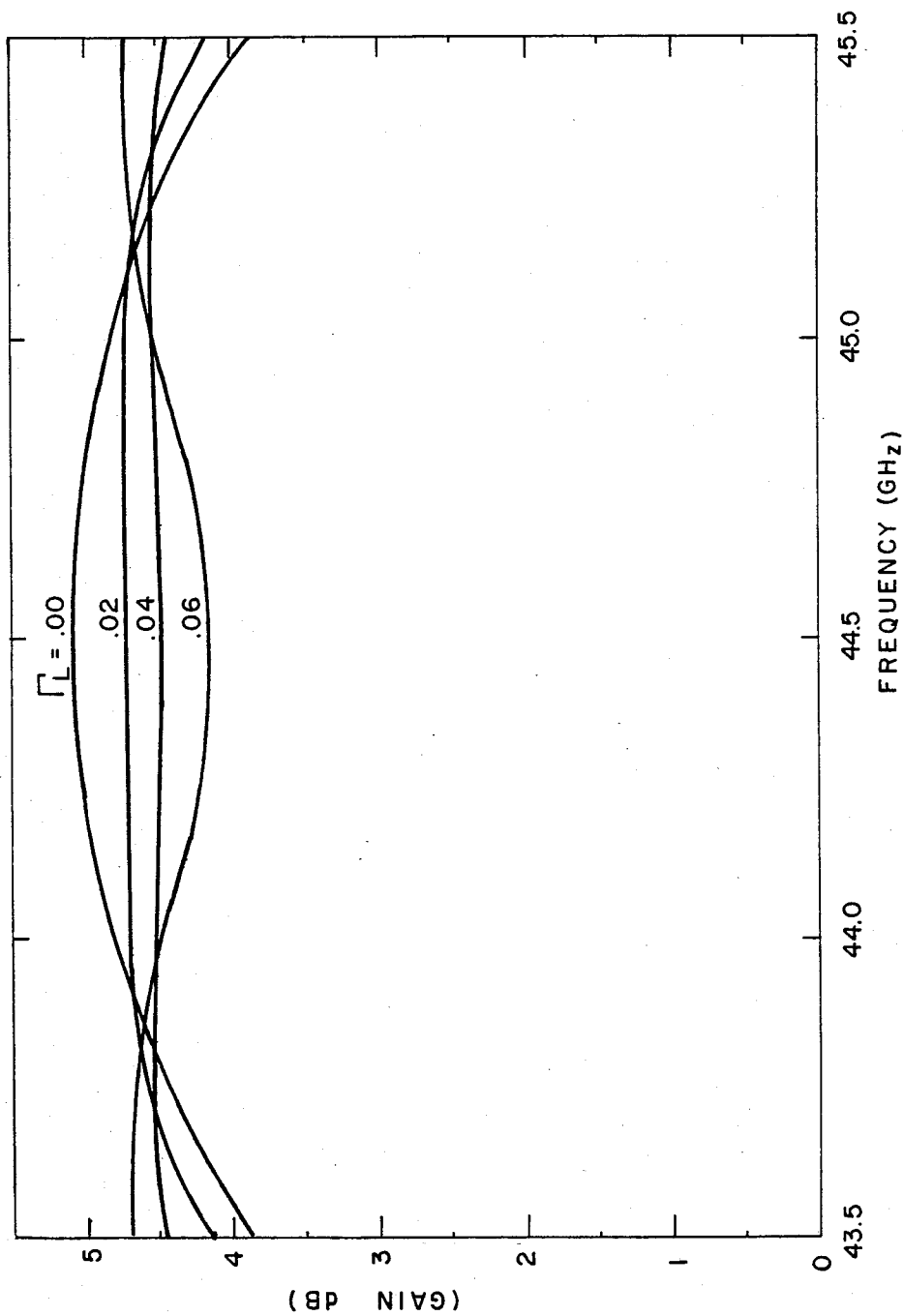
FIG. 4 are calculated plots of gain (magnitude) vs. frequency for the reflection amplifier of FIGS. 1-3 for different values of pertrubation impedance.

As shown in FIG. 4, the calculated gain response of the reflection amplifier briefly described above is shown for various values of reflections coefficient perturbation. For a reflection coefficient perturbation equal to 0.0, the gain is maximum at the center of the band (44.5 GHz) and falls off at the edges of the band. For a perturbation of 0.04, for example, the gain at the center of the band is reduced, whereas the gain at the edges of the band is increased by a near corresponding amount. In accordance, therefore, with the desired properties of the reflection amplifier and the bandwidth required of the reflection amplifier, the reflection coefficient perturbation is selectively adjusted between 0.0 to b 0.06, for example, to provide a requisite increase in gain at the edges of the band and a requisite decrease in gain at the center of the band.

A further advantage of using this so-called "double tuned" response at the output/input stage of the amplifier is that each amplifier stage is less susceptible to overdrive. Overdrive is a parametric effect which occurs to negative resistance devices when the r.f. voltage amplitude across the device becomes too large. With this condition, the added power of the device is degraded and spurious output signals are generated at undesired frequencies. This effect is most likely to occur in the center of the band where the gain and output power are highest. When the capacitance perturbation which acts as a tuner is added to the reflection amplifier, the gain and output power in the center of the band is reduced, thereby mitigating against the onset of overdrive. The substantial increase in gain flatness as shown in FIG. 4 is accomplished with a single, very simple tuning element. It is applicable to other types of power combiners (e.g., replicated combiners and hybrids), and it can be used with any one of a number of active devices connected to the combiner.

Having described preferred embodiments in the invention, it will now become apparent to one of skill in the art that other embodiments incorporating their concepts may be used. It is felt, therefore, that these embodiments should not be limited to disclosed embodi-

What is claimed is:

1. A microwave circuit comprising:
   a pair of negative resistance diode amplifiers each having an input/output port;
   means, having an input/output port and having a pair of ports, for passively combining said input/output ports of said pair of negative resistance diode amplifiers; and
   means disposed in said input/output port of said combining means for providing selected, equal perturbations in load impedance at the input/output poet of each one of said pair of diode amplifiers.

2. The circuit of claim 1 wherein said means for providing a selected perturbation includes a member which is disposed through an aperture provided in the input/output port of said combining means.

3. The circuit of claim 2 wherein said member is a dielectric member and provide a capacitive perturbation.

4. The circuit of claim 3 wherein said circuit has an initial gain characteristic over a selected band of operation and said perturbation reduces the gain of said circuit at the center of said selected band and increases the gain characteristic at the edges of said band.

5. The circuit of claim 4 wherein said combining means includes a magic T.

6. The circuit of claim 2 wherein said member is a conductive member and provides an inductive perturbation.

7. The circuit of claim 6 wherein said circuit has an initial gain characteristic over a selected band of operation and said perturbation reduces the gain of said circuit at the center of said selected band and increases the gain characteristic at the edges of said band.

8. The circuit of claim 7 wherein said combining means includes a magic T.

9. A microwave reflection amplifier circuit, comprising:
   first and second magic T's each having a pair of colinear arms, an E-plane arm, and an H-plane arm;
   first and second pairs of IMPATT diode modules coupled to the colinear arms of said respective first and second magic T's, with a first one of E-plane arms and H-plane arms of said first and second magic T's being terminated in a characteristic impedance;
   a third magic T having a pair of colinear arms, an E-plane arm and an H-plane arm, with said pair of colinear arms of the third magic T being coupled to a second one of the E-plane arms and H-plane arms of the first and second magic T's, with a first one of the E-plane arms and H-plane arms of the third magic T being terminated in a characteristic impedance and the second one of the E-plane arms and H-plane arms disposed as the input/output port of the circuit; and
   means disposed disposed in the input/output port of the third magic T for providing a small impedance perturbation in the output port to increase the gain flatness of the circuit.

10. The circuit as recited in claim 9 wherein the means for increasing the gain flatness includes a dielectric member ceramic rod disposed within a selected aperture provided in the input/output port of the third magic T.

11. The circuit of claim 10 wherein the magnitude of the perturbation is selected by controlling the depth of perturbation of the dielectric member.

12. The circuit of claim 11 wherein the phase characteristic of the perturbation is selected by controlling the location of the perturbation with respect to the electrical pathlength between the perturbation and the diode modulus.

* * * * *